(12) United States Patent
Krishnan et al.

(10) Patent No.: US 6,326,247 B1
(45) Date of Patent: Dec. 4, 2001

(54) METHOD OF CREATING SELECTIVELY THIN SILICON/OXIDE FOR MAKING FULLY AND PARTIALLY DEPLETED SOI ON SAME WAFFER

(75) Inventors: Srinath Krishnan, San Jose; Matthew S. Buynoski, Palo Alto, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 2 days.

(21) Appl. No.: 09/606,651

(22) Filed: Jun. 28, 2000

Related U.S. Application Data
(60) Provisional application No. 60/210,719, filed on Jun. 9, 2000.

(51) Int. Cl.[7] .............................. H01L 21/00; H01L 21/84
(52) U.S. Cl. ..................... 438/151; 438/149; 438/455; 438/458
(58) Field of Search .................................. 438/151, 311, 438/368, 370, 149, 517, 404, 430, 510, 914, 455, 458

(56) References Cited

U.S. PATENT DOCUMENTS

| | | |
|---|---|---|
| 5,145,802 | 9/1992 | Tyson et al. . |
| 5,670,387 | 9/1997 | Sun . |
| 5,670,388 | 9/1997 | Machesney et al. . |
| 5,940,691 | 8/1999 | Manning . |
| 5,942,781 | 8/1999 | Burr et al. . |
| 5,963,813 | 10/1999 | Manning . |
| 5,985,728 * | 11/1999 | Jennings ............................... 438/311 |
| 6,124,185 * | 9/2000 | Doyle ................................... 438/458 |
| 6,228,691 * | 5/2001 | Doyle ................................... 438/149 |
| 6,249,027 * | 6/2001 | Burr ..................................... 257/350 |

* cited by examiner

*Primary Examiner*—Matthew Smith
*Assistant Examiner*—Igwe U. Anya
(74) *Attorney, Agent, or Firm*—Amin & Turocy, LLP (57) ABSTRACT

A method for providing partially depleted and fully depleted transistor devices on the same semiconductor wafer. A semiconductive layer is provided having an oxide layer thereon. At least one trench is then etched into the oxide layer. The oxide layer is then filled with a substrate material layer and then ground and polished down to form a generally planar upper surface. The trench filled regions of the oxide layer form an oxide layer having regions of a first thickness and the remaining regions of the oxide layer are of a second thickness. The semiconductor wafer can then be flipped and partially depleted transistor devices formed over the regions of the first thickness and fully depleted transistor devices formed over regions of the second thickness.

20 Claims, 7 Drawing Sheets

METHOD OF CREATING SELECTIVELY THIN SILICON/OXIDE FOR MAKING FULLY AND PARTIALLY DEPLETED SOI ON SAME WAFFER

CROSS REFERENCE TO RELATED APPLICATIONS

This application claims the benefit of U.S. Provisional Patent Application Ser. No. 60/210,719, filed Jun. 9, 2000, entitled A METHOD OF CRATING SELECTIVELY THIN SILICON/OXIDE FOR MAKING FULLY AND PARTIALLY DEPLETED SOI ON SAME WAFER.

FIELD OF THE INVENTION

The present invention generally relates to the design of field effect transistors (FETS) and, more particularly, to a method of forming a metal oxide silicon (MOS) transistor structure including both fully depleted and partially depleted devices.

BACKGROUND OF THE INVENTION

As is known in the art, transistors such as metal oxide silicon (MOS) transistors, have been formed in isolated regions of a semiconductor body such as an epitaxial layer which was itself formed on a semiconductor, typically bulk silicon, substrate. With an n-channel MOS field effect transistor (FET), the body is of p-type conductivity and the source and drain regions are formed in the p-type conductivity body as $N^+$ type conductivity regions. With a p-channel MOSFET, the body, or epitaxial layer, is of n-type conductivity and the source and drain regions are formed in the n-type conductivity body as $P^+$ type conductivity regions. It has been suggested that the semiconductor body, or layer, be formed on an insulating substrate, or over an insulation layer formed in a semiconductor substrate. Such technology sometimes is referred to as Silicon-on-Insulator (SOI) technology. Silicon-on-Insulator MOS technologies have a number of advantages over bulk silicon MOS transistors. These advantages include: reduced source/drain capacitance and hence improved speed performance at higher-operating frequencies; reduced $N^+$ to $P^+$ spacing and hence higher packing density due to ease of isolation; and higher "soft error" upset immunity (i.e., the immunity to the effects of alpha particle strikes).

Silicon-on-Insulator technology is characterized by the formation of a thin silicon layer for formation of the active devices over an insulating layer, such as an oxide, which is in turn formed over a substrate. Transistor sources in drains are formed by, for example, implantations into the silicon layer while transistor gates are formed by forming a patterned oxide and conductor (e.g. metal) layer structure. Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). However, the floating body can introduce dynamic instabilities in the operation of such a transistor.

Conventional SOI FET's have floating bodies in which the body or channel region of the FET is located on an insulator and not electrically connected to a fixed potential. These devices are known as partially depleted SOI devices and have the aforementioned advantages and disadvantages.

Fully depleted SOI devices are those in which the layer of semiconductor is sufficiently thin, such that the entire thickness of the body regions is depleted of majority carriers when in the off state and both diffusions are at ground. Fully depleted devices offer additional advantages, such as reduced short channel effect, increased transconductance and reduced threshold voltage sensitivity to changes in body doping. Furthermore, the kink effects and threshold voltage shifts caused by body charging in partially depleted devices are reduced. The fully depleted devices do not have a neutral region in the channel and thus do no allow for charging and discharging of the body corresponding to he change in threshold voltage. Additionally, the fully depleted devices do no show hysterisis effect. Therefore, it is advantageous to be able to form a semiconductor wafer with both partially depleted and fully depleted devices based on the desired characteristics of the device for a given implementation.

SUMMARY OF THE INVENTION

The present invention provides a method for providing partially depleted and fully depleted transistor devices on the same semiconductor wafer. The present invention accomplishes this end by providing a silicon semiconductor having an oxide layer thereon. At least one trench is then etched into the oxide layer. A substrate material layer is then deposited onto the oxide layer filling the at least one trench and forming an insulating layer having regions of a first thickness at the at least one trench and regions of a second thickness everywhere except the at least one trench. The substrate layer is then ground and polished down to a desirable thickness. The device can then be flipped over and partially depleted transistor devices can then be formed over the regions of the first thickness and fully depleted transistor devices can be formed over regions of the second thickness.

One aspect of the invention relates to a method of forming an SOI MOSFET structure. The method comprises the steps of providing an insulating layer disposed over a semiconductive layer and etching at least one trench in the insulating layer. A substrate material is deposited over the insulating layer, which fills the at least one trench to form an insulating layer having a first thickness region and a second thickness region. The structure is then flipped over to expose the semiconductive layer. A partially depleted device in the semiconductive layer is formed over the first thickness region and a fully depleted device in the semiconductive layer is formed over the second thickness region.

Another aspect of the invention relates to an SOI MOSFET structure. The SOI MOSFET structure comprises an oxide layer disposed over a semiconductive layer and a substrate layer over the oxide layer. The substrate layer fills at least one trench disposed in the oxide layer. The at least one trench forms regions of the oxide layer having a first thickness and the remaining regions of the oxide layer are of a second thickness. The structure is flipped for forming partially depleted devices over the regions of first thickness and for forming fully depleted devices over the regions of a second thickness.

Yet another aspect of the invention relates to a method of forming fully depleted devices and partially depleted devices on the same semiconductor wafer. The method comprises the steps of providing an oxide layer disposed over a semiconductive layer and etching at least one trench in the oxide layer. A substrate material is deposited over the oxide layer and fills the at least one trench to form an insulating layer having a first thickness region and a second thickness region. A top surface of the substrate layer is reduced to a thickness suitable for forming a back gate. The semiconductor wafer is flipped and at least one partially depleted transistor device is formed over the first thickness region and at least one fully depleted transistor device is formed over the second thickness region.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention relates to a MOSFET structure provided with both partially depleted and fully depleted devices on a single SOI structure. The MOSFET structure and the methodology of making the MOSFET structure of the present invention allows for implementing both partially depleted devices and fully depleted devices on a single SOI structure, so as to provided a device that can exhibit faster performance, lower power consumption and less device hysteresis than many conventional MOSFET devices. The present invention will now be described with reference to the drawings, wherein like reference numerals are used to refer to like elements throughout. It should be understood that the description of this preferred embodiment is merely illustrative and that it should not be taken in a limiting sense.

Figure 1:
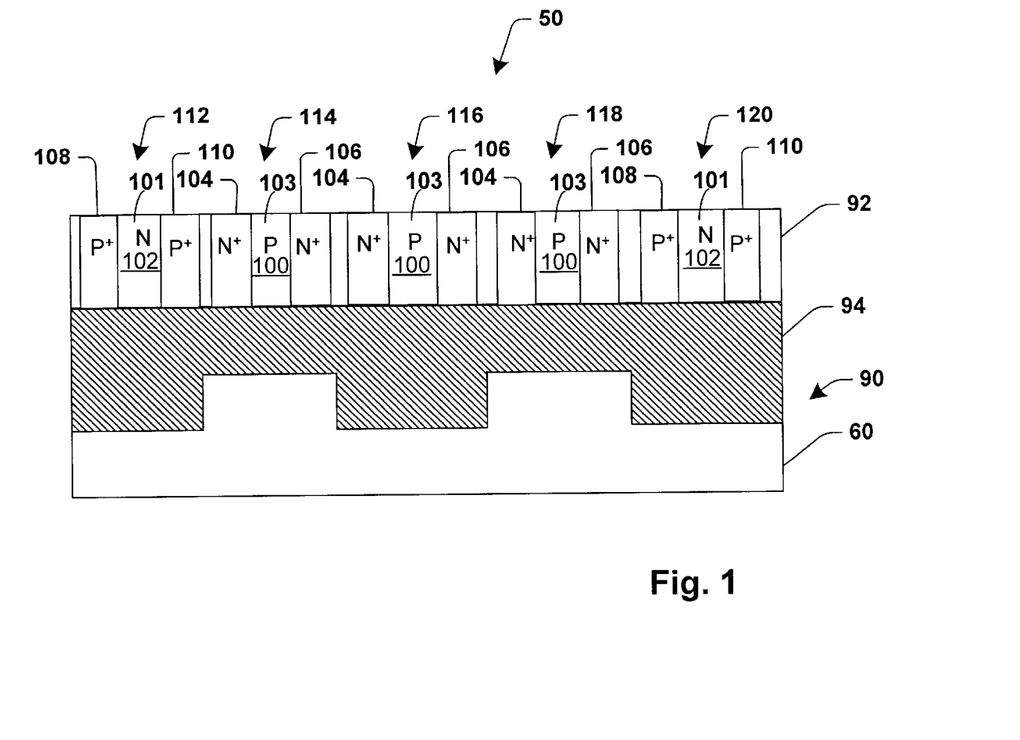
FIG. 1 is a schematic cross-sectional illustration of an SOI MOSFET structure in accordance with one aspect of the present invention.

FIG. 1 is a schematic cross-sectional illustration of an SOI MOSFET structure 50 in accordance with the present invention. The device structure 50 includes a base 60 comprising silicon, for example. The base 60 provides mechanical support for the device structure 50 and can act as a back gate during operation. The base 60 is of a thickness suitable for providing such support. A dielectric layer 94 (e.g., $SiO_2$, $Si_3N_4$) resides over the base 60. The thickness of the dielectric layer 94 is preferably within the range of 1000 Å to 5000 Å. The base 60 and the dielectric layer 94 form a bottom portion 90 of the SOI structure 50. The insulating layer is formed over a thin semiconductor layer 92. Trenches are etched into the dielectric layer 94. The base is formed by depositing silicon over the dielectric layer 94 filling the trenches. The device structure is then flipped providing a semiconductive material layer 92 having insulating regions of a first thickness for partially depleted devices and insulating regions of a second thickness for fully depleted devices. The semiconductive layer 92 becomes the active region for device fabrication.

The structure 50 includes a number of partially depleted and fully depleted devices. A fully depleted PMOS device 112 and a fully depleted PMOS device 120 are provided on the ends of the structure 50. Each PMOS device includes a $P^+$ source region 108, a $P^+$ drain region 110 and a N type body region 102. A fully depleted NMOS device 116 is provided in the center of the structure 50. A partially depleted NMOS device 114 and a partially depleted NMOS device 118 are provided on opposite sides of the fully depleted NMOS device 116. Each NMOS device includes a $N^+$ source region 104, a $N^+$ drain region 106 and a P type body region 100. It is to be appreciated that any number of partially depleted and fully depleted devices can be implemented onto the structure 50 only limited by the space of the structure. A channel region 101 is formed between the source region 108 and the drain region 110 of the PMOS devices 112 and 120, and a channel region 103 is formed between the source region 104 and the drain region 106 of the NMOS devices 114, 116 and 118.

In one specific embodiment of the present invention, the source/drain regions for the NMOS devices include an arsenic or phosphorous implant having a dose concentration in the range of $1 \times 10^{18}$ to $1 \times 10^{20}$ atoms/cm$^2$ and implanted at an energy range of about 1 KeV to about 100 KeV and the source/drain regions for the PMOS devices include a boron implant having a dose concentration in the range of $1 \times 10^{18}$ to $1 \times 10^{20}$ atoms/cm$^2$ and implanted at an energy range of about 1 KeV to about 100 KeV. The p-type body 100 includes a P$^+$ implant (e.g., boron) having a dose within the range of $1 \times 10^{10}$ to $1 \times 10^{14}$ atoms/cm$^2$. The n-type body 102 includes an N$^+$ implant (e.g., arsenic, phosphorous) having a dose within the range of $1 \times 10^{10}$ to $1 \times 10^{14}$ atoms/cm$^2$.

Figure 2:
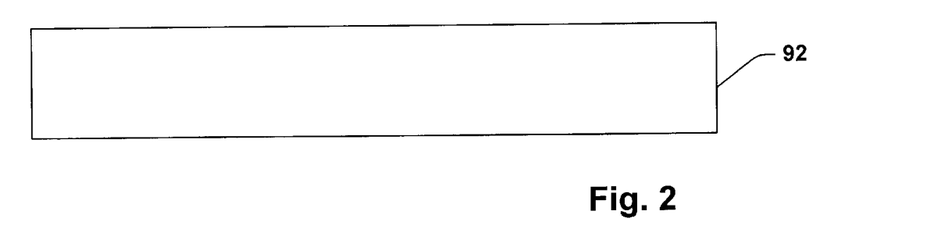
FIG. 2 is a schematic cross-sectional illustration of a silicon substrate layer in accordance with one aspect of the present invention.
Figure 3:
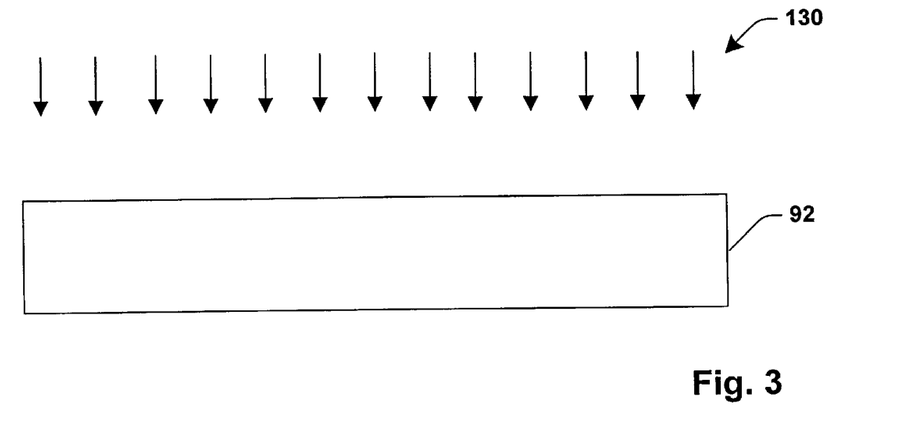
FIG. 3 is a schematic cross-sectional illustration of the silicon substrate layer of FIG. 2 undergoing an insulation deposition step in accordance with one aspect of the present invention.
Figure 4:
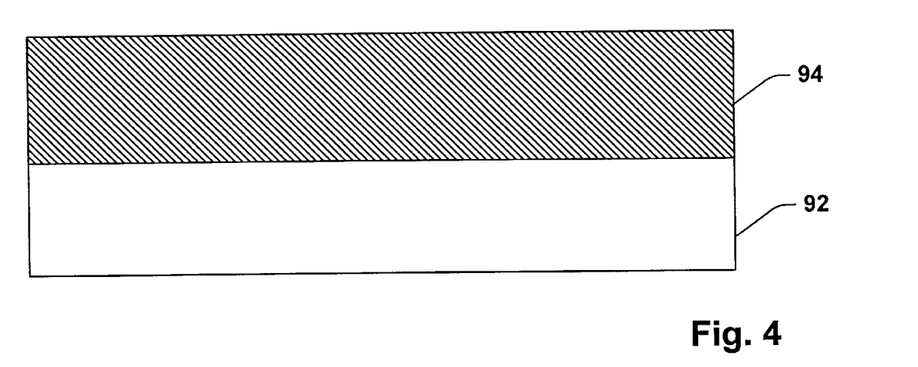
FIG. 4 is a schematic cross-sectional illustration of the structure of FIG. 3 with an insulation layer formed thereon in accordance with one aspect of the present invention.

Turning now to FIGS. 2–18, fabrication steps in connection with forming the structure 50 of FIG. 1 are discussed. FIG. 2 illustrates a thin semiconductive layer 92 in its early stages of fabrication. FIGS. 3–9 illustrate process steps associated with fabrication of the MOSFET device 50 (FIG. 1) in accordance with the present invention. A layer of insulating material 94 is formed on the semiconductive layer 92 step 130 (FIG. 3) using a high density plasma chemical vapor deposition (HDPCVD) resulting in the structure of FIG. 4. As is known, HDPCVD is a self-planarizing process which facilitates reduction of the chemical mechanical polishing (CMP) times required in subsequent steps. (See, e.g., Pye, J. T. et al., High-density plasma CVD and CMP for 0.25 μm intermetal dielectric processing, Solid State Technology, Dec. 1995, pgs. 65–71). The insulating material layer 94 is preferably and oxide.

Alternatively, the oxide layer 94 can be is formed via a SIMOX (Separation by Implantation of Oxygen) process. The basic steps of the SIMOX process involve implanting oxygen beneath the surface of a semiconductor substrate 92. An annealing step is next performed to coalesce the implanted oxygen atoms into a uniform layer of SiO$_2$. The oxide layer 94 is typically 0.1 to 0.5 μm thick and exhibit almost complete incorporation of the implanted oxygen. Typical implant energies range from 150 to 200 keV, while the oxygen dose may vary from 1 to 2E18 cm$^{-2}$.

Figure 5:
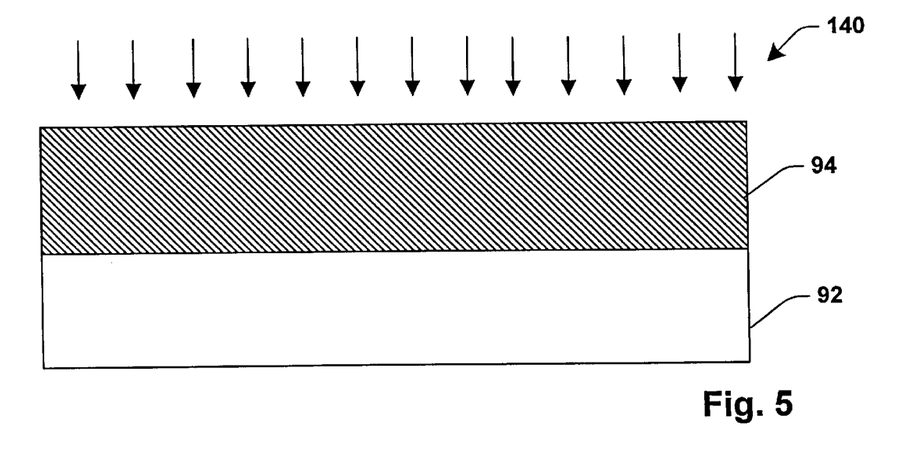
FIG. 5 is a schematic cross-sectional illustration of the structure of FIG. 4 undergoing an etching step in accordance with one aspect of the present invention.
Figure 6:
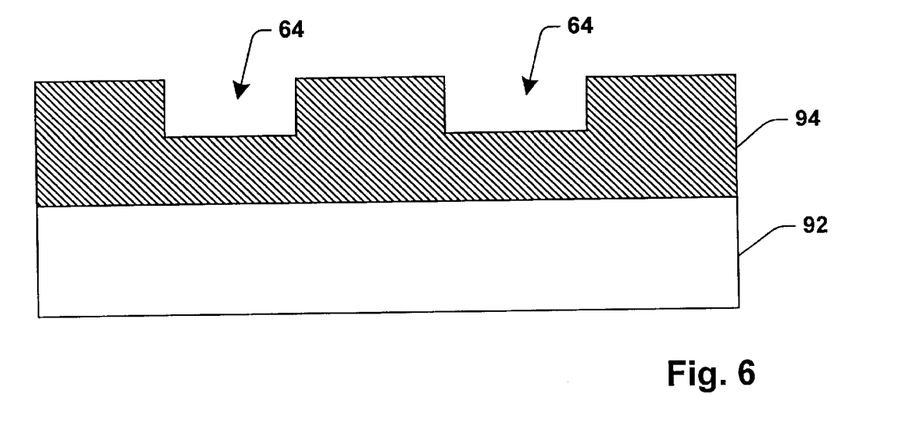
FIG. 6 is a schematic cross-sectional illustration of the structure of FIG. 5 with trench regions formed therein in accordance with one aspect of the present invention.

FIG. 5 illustrates an etching step 140 of the oxide layer 94. The oxide etch is performed so as to form trench regions 64 in the oxide layer 94 (FIG. 6). In particular, a trench resist material (not shown) is applied to cover the structure and is then patterned to expose the regions above the trench regions 64. The trench regions 64 are then etched into the oxide layer 94 using suitable techniques. The trench resist material is thereafter stripped so as to result in the structure shown in FIG. 6.

Figure 7:
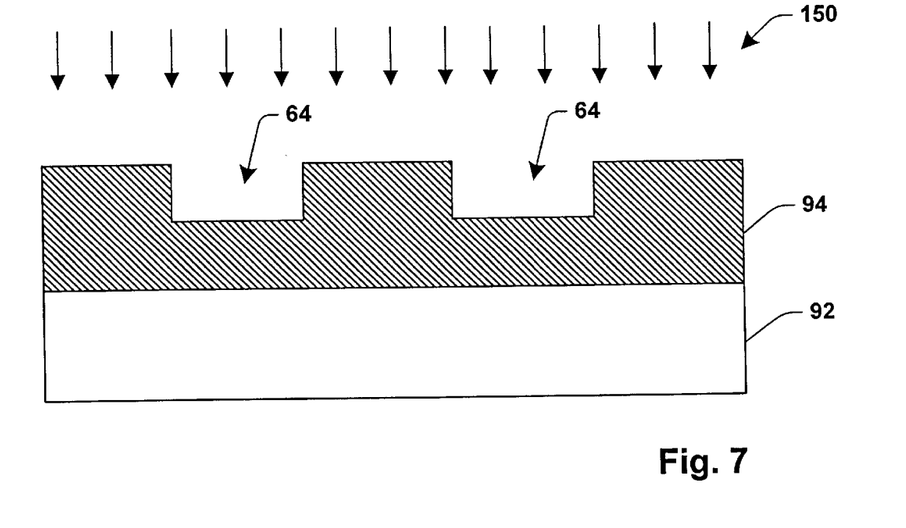
FIG. 7 is a schematic cross-sectional illustration of the structure of FIG. 6 undergoing a deposition step in accordance with the present invention.
Figure 8:
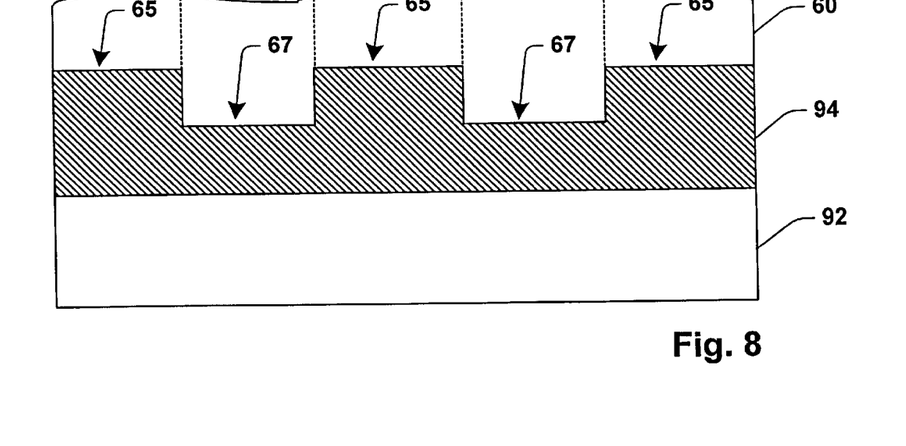
FIG. 8 is a schematic cross-sectional illustration of the structure of FIG. 7 including a semiconductive layer over the insulating layer in accordance with one aspect of the present invention.
Figure 9:
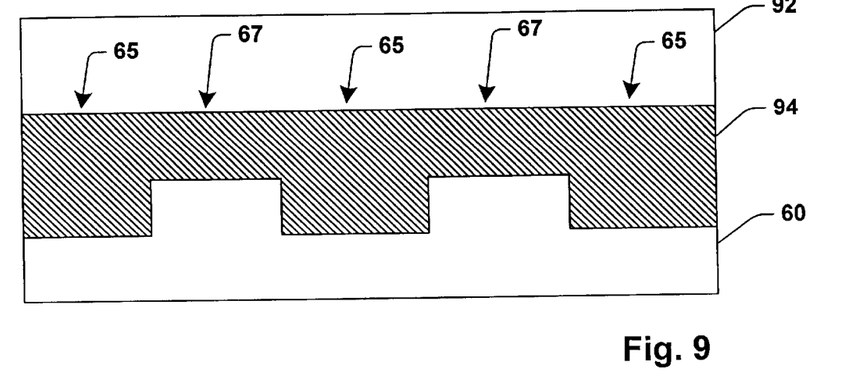
FIG. 9 is a schematic cross-sectional illustration of the structure of FIG. 8 after undergoing a grinding and polishing step in accordance with one aspect of the present invention.

FIG. 7 illustrates a deposition step 150 of a substrate material 60 onto the oxide layer 94. The substrate material 60, preferably silicon, is deposited over the oxide material layer 94 filling the trench regions 64 (FIG. 8). This provides an insulating layer 94 having regions of a first thickness 67 for forming partially depleted devices and regions of a second thickness 65 for forming fully depleted devices. Following deposition of the substrate material 60, the top surface of the substrate layer is then ground and polished to an appropriate thickness for use as a back gate. An alternative to grinding to achieve the appropriate thicknesses for use as a back gate, is to implant hydrogen to achieve the appropriate thicknesses. The top surface of the substrate layer 60 is ground and polished to form a generally planar top surface and then can be flipped over for doping of semiconductive layer 92 (FIG. 9). The oxide material layer 94 and the substrate layer 60 form a bottom portion 90 of the structure 50. Thus, the formation of the structure 50 is substantially complete in relevant part, except for the formation of the transistor devices.

Turning now to FIGS. 10–18, process steps in connection with completion of the MOSFET device 50 in accordance with the present invention are described. Although the present invention is described in the context of fabricating NMOS and PMOS type devices it is to be appreciated that the present invention has applicability to a variety of transistor devices. The present description will enable those skilled in the art to practice the invention with respect to a vast number of different types of transistor devices which are intended to fall within the scope of the invention as defined by the hereto appended claims.

Figure 10:
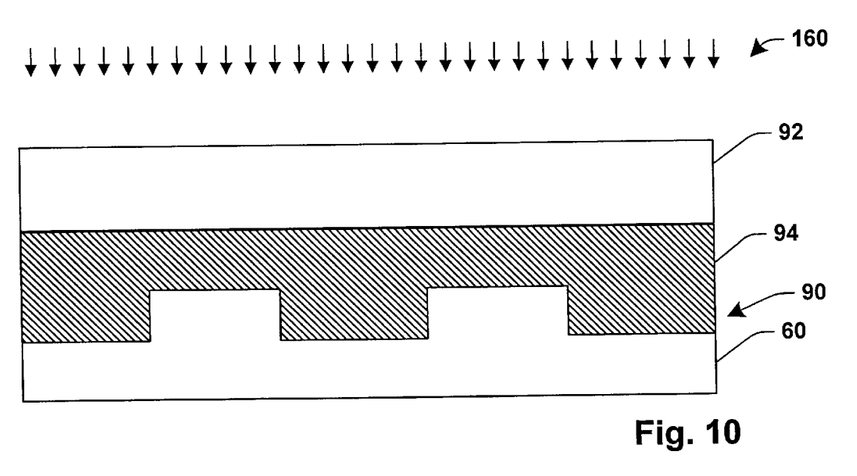
FIG. 10 is a schematic cross-sectional illustration of the structure of FIG. 9 undergoing an ion implant step to form p-type body regions in accordance with one aspect of the present invention.
Figure 11:
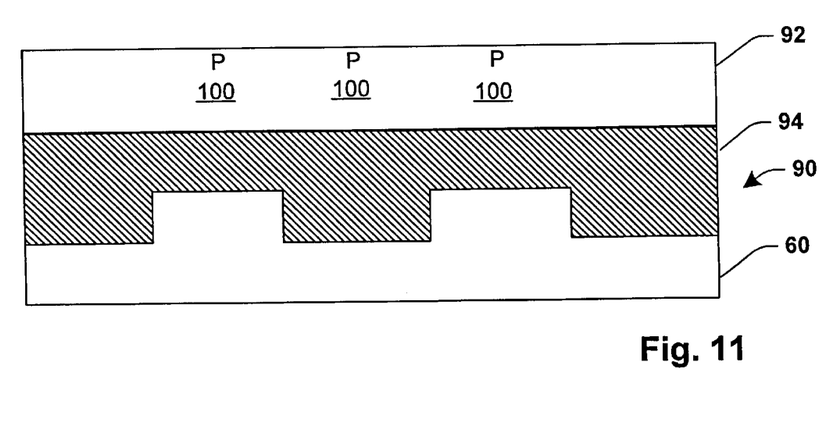
FIG. 11 is a schematic cross-sectional illustration of the structure of FIG. 10 after the ion implant to form p-type body regions in accordance with one aspect of the present invention.
Figure 12:
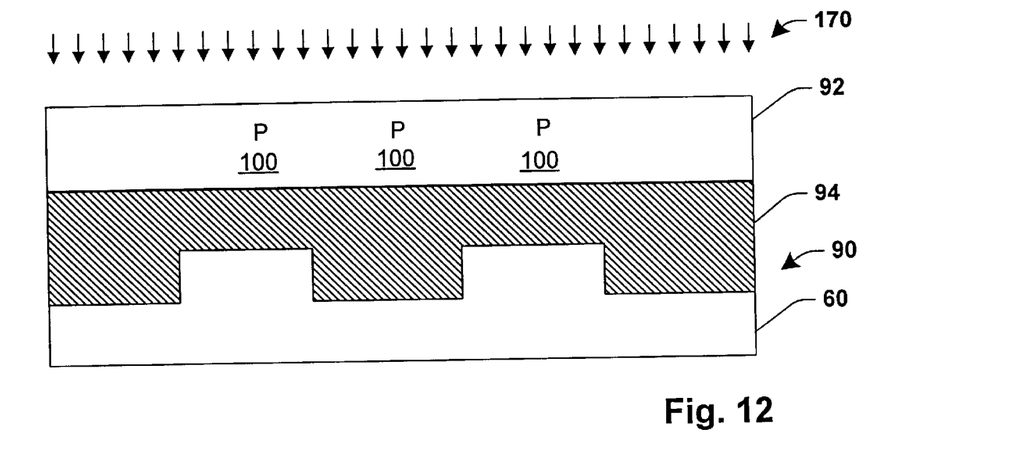
FIG. 12 is a schematic cross-sectional illustration of the structure of FIG. 11 undergoing an ion implant step to form n-type body regions in accordance with one aspect of the present invention.
Figure 13:
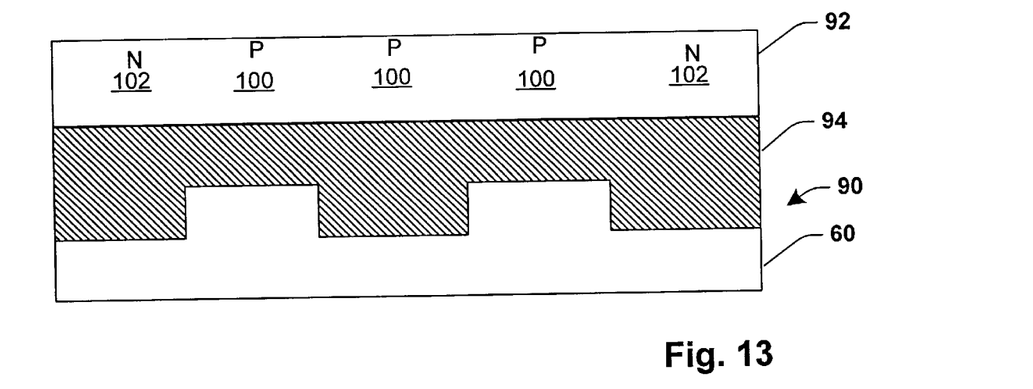
FIG. 13 is a schematic cross-sectional illustration of the structure of FIG. 12 after the ion implant to form n-type body regions in accordance with one aspect of the present invention.

FIG. 10 shows the formation of the p-type body regions 100 by masking a portion of the semiconductive layer 92 with a photoresist layer (not shown) and implanting p-well dopants 160 to provide the p-type body regions 100 as illustrated in FIG. 11. Thereafter as shown in FIG. 12 the formation of the n-type body regions 102 by masking a portion of the semiconductive layer 92 with a photoresist layer (not shown) and implanting n-well dopants 170 to provide the n-type body regions 102 as illustrated in FIG. 13.

Figure 14:
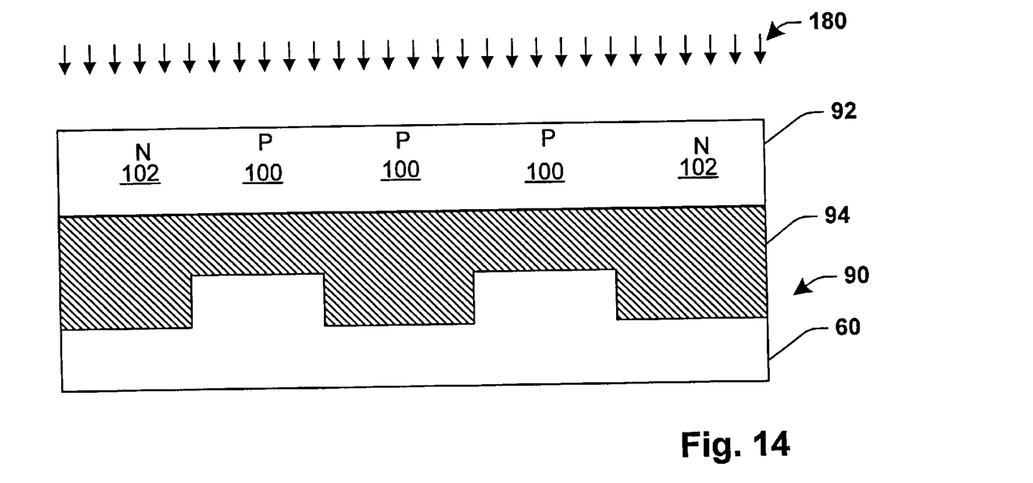
FIG. 14 is a schematic cross-sectional illustration of the structure of FIG. 13 undergoing an ion implant step to form $N^+$ source/drain (S/D) regions in accordance with one aspect of the present invention.
Figure 15:
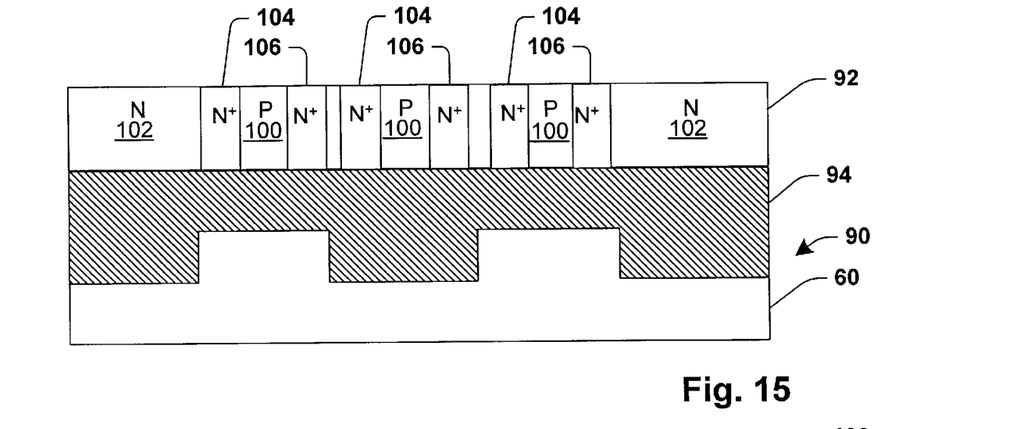
FIG. 15 is a schematic cross-sectional illustration of the structure of FIG. 14 after undergoing the ion implant step to form $N^+$ source/drain (S/D) regions in accordance with one aspect of the present invention.

FIG. 14 illustrates an n-region ion implant step. An N$^+$ implant 180 is used to form n-channel transistor source region 104 and drain region 106 (FIG. 15). In the preferred embodiment, this implant step may be an arsenic implant for example having a dose in the range of $1 \times 10^{18}$ to $1 \times 10^{20}$ atoms/cm$^2$ and an energy range of about 1 KeV to about 100 KeV. Arsenic is employed to make a substantially shallow junction because of its heavy nature and less tendency to move. Of course it will be appreciated that any suitable dose and energy range and implant may be employed to carry out the present invention. As the doping concentration of the source/drain regions is decreased, although the junction capacitance decreases, the resistivity of the source/drain regions increase which can cause the transistor to slow down. It is believed that between source/drain dopant concentrations of $10^{17}$/cm$^3$ and $10^{20}$/cm$^3$, however, that an optimal point exists where the low junction capacitance best compensates for the increased source/drain resistance.

Figure 16:
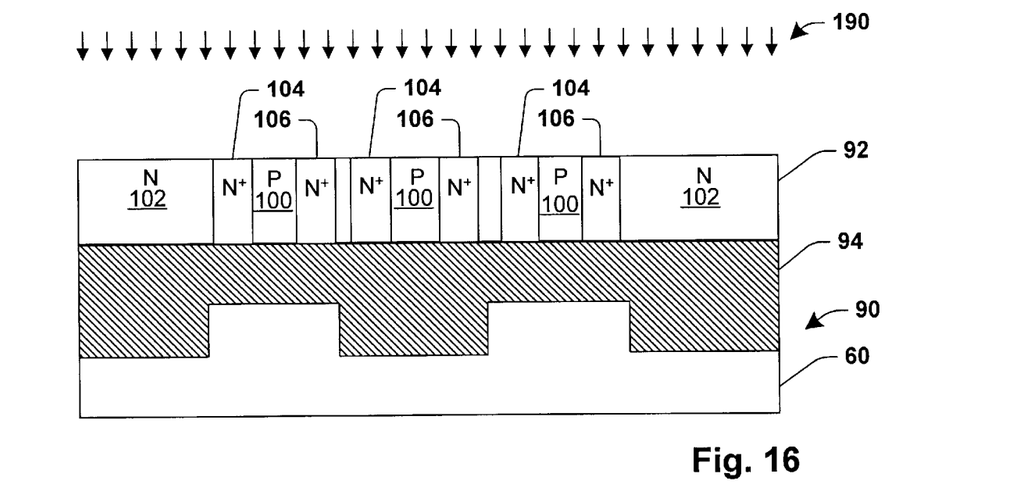
FIG. 16 is a schematic cross-sectional illustration of the structure of FIG. 15 undergoing an ion implant step to form $P^+$ source/drain (S/D) regions in accordance with one aspect of the present invention.
Figure 17:
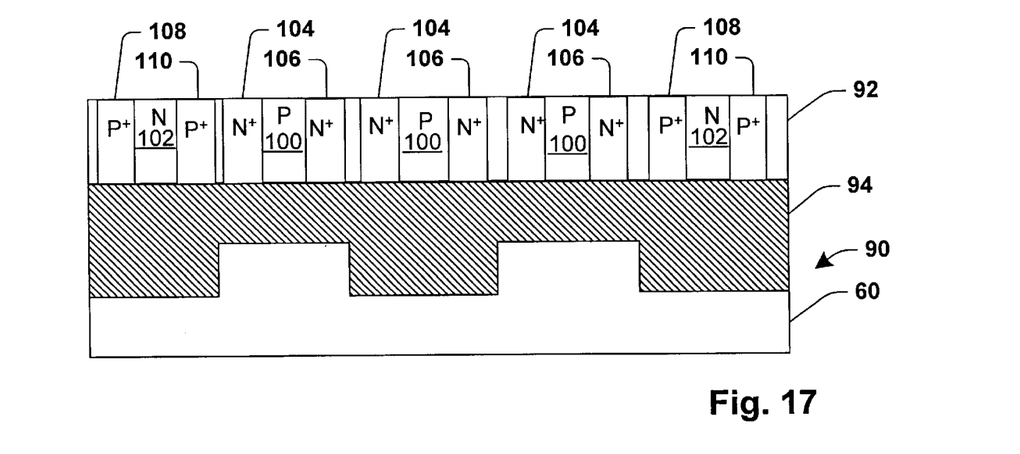
FIG. 17 is a schematic cross-sectional illustration of the structure of FIG. 16 after undergoing the ion implant step to form $P^+$ source/drain (S/D) regions in accordance with one aspect of the present invention.
Figure 18:
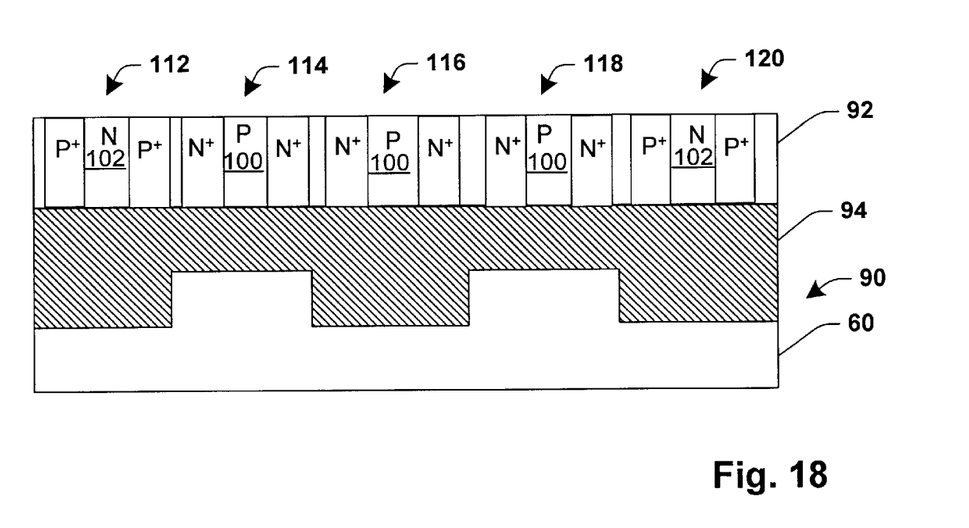
FIG. 18 is a schematic cross-sectional illustration of the structure of FIG. 17 having fully depleted and partially depleted devices in accordance with one aspect of the present invention.

FIG. 16 illustrates a p-region ion implant step. A P$^+$ implant 190 is used to form p-channel transistor source region 108 and drain region 110 (FIG. 17). In the preferred embodiment, this implant step may be a boron implant for example having a dose in the range of $1 \times 10^{18}$ to $1 \times 10^{20}$ atoms/cm$^2$ and an energy range of about 1 KeV to about 100 KeV. The structure 50 is substantially complete in relevant part as illustrated in FIG. 18. The structure 50 includes a fully depleted PNP transistor device 112, a fully depleted PNP transistor device 120 and a fully depleted NPN device 116. The structure 50 also includes a partially depleted NPN transistor devices 114 and 118. Any number of partially depleted and fully depleted devices can be provided on a single SOI structure by employing the present methodology.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming an SOI MOSFET structure comprising the steps of:

providing an insulating layer disposed over a semiconductive layer;

etching at least one trench in the insulating layer;

depositing a substrate layer made of silicon material over the insulating layer and filling the at least one trench to form an insulating layer having a first thickness region and a second thickness region;

flipping the structure over to expose the semiconductive layer;

forming a partially depleted device in the semiconductive layer over the first thickness region; and forming a fully depleted device in the semiconductive layer over the second thickness region.

2. The method of claim 1, further including the step of planarizing a top surface of the substrate layer.

3. The method of claim 2, further including the step of reducing the top surface of the substrate layer to a thickness suitable for forming a back gate.

4. The method of claim 3, the step of reducing a top surface of the substrate layer being accomplished by grinding the top surface of the substrate layer.

5. The method of claim 4, further including the step of polishing the substrate layer after the step of grinding.

6. The method of claim 3, the step of reducing a top surface of the substrate layer being accomplished by implanting hydrogen into the surface of the substrate layer.

7. The method of claim 1, further including the step of forming at least one partially depleted transistor device over the first thickness region and at least one fully depleted transistor device over the second thickness region.

8. The method of claim 7, the at least one partially depleted device and the at least one fully depleted device each being one of an NMOSFET device and a PMOSFET device.

9. The method of claim 1, the second thickness region being thicker than the first thickness region.

10. The method of claim 1, the insulating layer being an oxide.

11. An SOI MOSFET structure comprising;

an oxide layer disposed over a semiconductive layer;

a substrate layer disposed over the oxide layer, the substrate layer filling at least one trench disposed in the oxide layer, the at least one trench forming regions of the oxide layer of a first thickness and the remaining regions of the oxide layer being of a second thickness, wherein the structure is flipped exposing the semiconductive layer for forming partially depleted devices over the regions of first thickness and for forming fully depleted devices over the regions of a second thickness.

12. The structure of claim 11, the top surface of the substrate layer being ground and polished to an appropriate thickness for forming a back gate.

13. The structure of claim 11, further including at least one partially depleted transistor device being disposed in a region over the first thickness and at least one fully depleted transistor device being disposed in a region over the second thickness.

14. The structure of claim 13, the at least one partially depleted device and the at least one fully depleted device each being one of an NMOSFET device and a PMOSFET device.

15. The structure of claim 11, the first thickness being thicker than the second thickness.

16. A method of forming fully depleted devices and partially depleted devices on a semiconductor wafer, comprising the steps of:

providing an oxide layer disposed over a semiconductive layer;

etching at least one trench in the oxide layer;

depositing a substrate layer made of silicon material over the oxide layer and filling the at least one trench to form an oxide layer having a first thickness region and a second thickness region;

reducing a top surface of the substrate layer to a thickness suitable for forming a back gate;

flipping the semiconductor wafer exposing the semiconductive layer; and forming at least one partially depleted transistor device over the first thickness region and at least one fully depleted transistor device over the second thickness region.

17. The method of claim 16, the step of reducing a top surface of the substrate layer being accomplished by grinding the top surface of the substrate layer.

18. The method of claim 17, further including the step of polishing the substrate layer after the step of grinding.

19. The method of claim 16, the step of reducing a top surface of the substrate layer being accomplished by implanting hydrogen into the surface of the substrate layer.

20. The structure of claim 16, the at least one partially depleted device and the at least one fully depleted device each being one of an NMOSFET device and a PMOSFET device.

* * * * *